US012609669B2

(12) United States Patent
Strohmeier et al.

(10) Patent No.: US 12,609,669 B2
(45) Date of Patent: Apr. 21, 2026

(54) WIRELESS POWER TRANSMISSION SYSTEM AND WIRELESS POWER SUPPLY FOR A VEHICLE

(71) Applicant: Delta Electronics (Thailand) Public Co., Ltd., Samutprakarn (TH)

(72) Inventors: Sascha Strohmeier, Ihringen (DE); Andrew Green, Malsburg-Marzell (DE); Ulrich Richter, Freiburg (DE)

(73) Assignee: Delta Electronics (Thailand) Public Co., Ltd., Samutprakarn (TH)

( * ) Notice: Subject to any disclaimer, the term of this patent is extended or adjusted under 35 U.S.C. 154(b) by 84 days.

(21) Appl. No.: 18/636,259

(22) Filed: Apr. 16, 2024

(65) Prior Publication Data

US 2024/0364292 A1      Oct. 31, 2024

(30) Foreign Application Priority Data

Apr. 27, 2023    (EP) ..................................... 23170475

(51) Int. Cl.
  H03H 7/38       (2006.01)
  B60L 53/122      (2019.01)
  H03H 7/01       (2006.01)
(52) U.S. Cl.
  CPC ............. H03H 7/38 (2013.01); B60L 53/122 (2019.02); H03H 7/0115 (2013.01); B60L 2210/40 (2013.01)
(58) Field of Classification Search
  CPC .......... H02J 50/005; H02J 50/12; H02J 50/10; H02J 2207/20; H02J 7/02; H01F 27/24; H01F 27/2823; H03H 7/38; H03H 7/0115; B60L 53/122; B60L 2210/40; H02M 1/126
  See application file for complete search history.

(56) References Cited

U.S. PATENT DOCUMENTS

| | | | |
|---|---|---|---|
| 2008/0309158 A1 | 12/2008 | Schierling | |
| 2014/0044293 A1* | 2/2014 | Ganem ..................... | H04R 3/00 |
| | | | 381/74 |
| 2016/0241046 A1* | 8/2016 | Lee .......................... | H02J 50/90 |
| 2019/0386628 A1* | 12/2019 | Venugopal .............. | H02J 50/10 |

FOREIGN PATENT DOCUMENTS

| | | |
|---|---|---|
| CN | 212516750 U | 2/2021 |
| CN | 112701804 A | 4/2021 |
| CN | 113690012 A | 11/2021 |
| TW | 565998 B | 12/2003 |
| WO | 2018128150 A1 | 7/2018 |

OTHER PUBLICATIONS

The extended European search report issued on Oct. 23, 2023.

* cited by examiner

*Primary Examiner* — John W Poos
(74) *Attorney, Agent, or Firm* — CKC & Partners Co., LLC

(57)      ABSTRACT

The present disclosure concerns a wireless power transmission system, comprising a primary electronic unit, a transmitter unit for wireless power transmission; at least one electrical conductor connecting the primary electronic unit and the transmitter unit, wherein the primary electronic unit is configured to supply an electric signal to the transmitter unit via the at least one electrical conductor, and a passive quadripole disposed between the primary electronic unit and the transmitter unit and comprising a frequency selective impedance for impedance matching between an output of the primary electronic unit and the at least one electrical conductor.

19 Claims, 5 Drawing Sheets

WIRELESS POWER TRANSMISSION SYSTEM AND WIRELESS POWER SUPPLY FOR A VEHICLE

CROSS-REFERENCE TO RELATED APPLICATION

This application claims priority to European Patent Application No. 23170475.0, filed on Apr. 27, 2023, which is hereby incorporated by reference in its entirety.

TECHNICAL FIELD

The present disclosure concerns a wireless power transmission system and a wireless power supply for a vehicle.

BACKGROUND

Wireless power transmission systems as well as wireless power supplies comprising such wireless power transmission systems are commonly known, from for example CN113690012A or CN112701804A.

Further, a current limiter is known from for example WO2018/128150A1.

Commonly, Li Ion batteries are charged with high charging currents, for example 600 A. This commonly requires a heavy duty connector as well as a charging cable with a thick copper diameter. Such connectors however wear out quickly, especially when included in public charging stations. Further, such cables are heavy and hard to handle. One solution to such problems is charging such batteries via wireless power transmission or wireless power transfer ("WPT").

Therein, however, a wall box as a primary electronic unit is connected to a primary pad for wirelessly transmitting electric power. The wall box contains the primary power electronics and converts electric energy taken from the grid to an alternating current with a set operating frequency, and feeds this current to the primary pad over a cable.

Therein, however, the problem arises in that the cable has its own resonance frequency, which causes significant current ringing in the output of an inverter of the wall box with each change of polarity in an output voltage output by the inverter, i.e. the wall box. In other words, the cable's resonance frequency causes significant current ringing with each zero-crossing of current/voltage output by the inverter.

SUMMARY

It is an object of the present disclosure to provide a wireless power transmission system with an improvement of electromagnetic interference behavior (EMI behavior), with higher reliability, and with low current ringing.

The solution of this object is achieved by the features of the independent claim. The dependent claims concern embodiments of the present disclosure.

In particular, the solution of this object is achieved by a wireless power transmission system comprising a primary electronic unit, a transmitter unit for wireless power transmission, at least one electrical conductor and a passive quadripole. Therein, the at least one electrical conductor connects the primary electronic unit and the transmitter unit, and the primary electronic unit is configured to supply an electric signal to the transmitter unit via the at least one electrical conductor. Furthermore, the passive quadripole is disposed between the primary electronic unit and the transmitter unit and comprises a frequency selective impedance for impedance matching between an output of the primary electronic unit and the at least one electrical conductor.

Thereby, the passive quadripole comprises a frequency selective impedance which can damp a ringing caused by an impedance mismatch between the primary electronic unit and the at least one electrical conductor. Thereby, the reliability of the wireless power transmission system is increased and the EMI behavior thereof is improved. Furthermore, this is achieved without increasing an impedance of the primary electronic unit for a fundamental operating frequency of the primary electronic unit in an implementation. In an implementation, the "fundamental operating frequency of the primary electronic unit" is defined as a frequency of alternating current output to the transmitter unit for power transmission. In other words, the fundamental operating frequency is the frequency at which the primary electronic unit and/or the transmitter unit are configured to fundamentally operate.

In an implementation, the primary electronic unit is a power supply which supplies electric power to the transmitter unit. In an implementation, the primary electronic unit comprises an inverter.

In one embodiment, the primary electronic unit is a wall box connected to an energy grid and converts electric energy taken therefrom to an alternating current with a set frequency which is fed to the transmitter unit via the at least one electrical conductor.

In an implementation, the transmitter unit comprises at least one coil, a flux guiding element, and a capacitor. The transmitter unit induces a magnetic field that is directed to a secondary side receiver unit for receiving the wireless power transmitted by the transmitter unit in an implementation. Therein, in an implementation, the secondary unit comprises a coil, a flux guiding element, and a capacitor, and converts the received magnetic field into an electronic current.

In an implementation, the at least one electrical conductor passes through the passive quadripole. In an implementation, the at least one electrical conductor passes through the passive quadripole without being wound around said passive quadripole and/or without being wound around a component of said passive quadripole. In this regard, "being wound around" refers to at least one full winding turn.

In one embodiment, the passive quadripole is an inductor.

In an implementation, the inductor is a magnetic core, especially a ferrite core.

In an implementation, the passive quadripole comprises a frequency selective impedance for impedance matching only between the output of the primary electronic unit and the at least one electrical conductor. In other words, the passive quadripole provides impedance matching only between the primary electronic unit and the at least one electrical conductor in an implementation.

In an implementation, no further impedance element is connected between the primary electronic unit and the electrical conductor. Further in an implementation, no further impedance element is connected between the electrical conductor and the transmitter unit. Further in an implementation, no further impedance element is connected directly to the electrical conductor and/or directly to the primary electronic unit and/or directly to the transmitter unit, and for any one of the foregoing cases, especially not on the output side of the primary electronic unit.

Advantageously, the magnetic core comprises at least one E-shaped magnetic core component and an I-shaped magnetic field core component.

In an implementation, the E-shaped magnetic core component comprises one body portion and three leg portions extending therefrom in the shape of an "E".

In addition or alternatively thereto, the magnetic core comprises at least one W-shaped magnetic core component, comprising one body portion and four or more leg portions extending therefrom in the shape of a "W" in an implementation. Such W-core components are also referred to as "rake-shaped core components".

In an implementation, the I-shaped magnetic core component is a plate-shaped magnetic core component, which especially does not comprise legs extending therefrom.

In one embodiment, the at least one electrical conductor, especially respectively, passes through windows defined between two adjacent magnetic legs of the E-shaped magnetic core component and the I-shaped magnetic core component. In other words, in an implementation, a window is defined as a space defined between two legs of the E-shaped magnetic core component and the I-shaped magnetic core component. Therein, each window is square-shaped in an implementation.

In an implementation, each window is defined by the two adjacent magnetic legs of the E-shaped magnetic core component as well as the body portion of the E-shaped magnetic core component and the respective portion of the I-shaped magnetic core component opposite the body portion of the E-shaped magnetic core component between the two legs of the E-shaped magnetic core component.

In an implementation, the at least one electrical conductor respectively comprises a plurality of wires. Therein, at least one of the wires is defined as a first wire carrying a forward signal to the transmitter unit. Further, at least one other of the plurality of wires is defined as a second wire carrying a return signal to the primary electronic unit. Therein, the at least one first wire and the at least one second wire pass through different windows. In other words, the at least one first wire and the at least one second wire do not pass through the same windows.

In an implementation, the aforementioned first wire is connected to one pole of the primary electronic unit, specifically, the inverter thereof. In an implementation, the second wire is connected to another pole of the primary electronic unit, specifically, the inverter thereof.

In an implementation, especially in consideration of the primary electronic unit transmitting an alternating current to the transmitter unit, the definitions of the first wire and the second wire are interchangeable.

In an implementation, the at least one electrical conductor is a cable comprising the plurality of wires, wherein the wires are insulated from one another.

In an implementation, the wireless power transmission system comprises a plurality of electrical conductors. In an alternative exemplary embodiment, the wireless power transmission system comprises exactly one electrical conductor, especially as the aforementioned cable, connecting the primary electronic unit and the transmitter unit.

In an implementation, for improved selective impedance matching, the passive quadripole comprises at least one, especially two, capacitor respectively connected between the first wire and the second wire. Each of the multiple capacitors is provided on one side, i.e. before and after passing through, of the magnetic core in an implementation.

The passive quadripole may comprise only one of the capacitors, or three or more of the capacitors in an implementation. In particular, in case of a plurality of first wires and a plurality of second wires, the passive quadripole may comprise one or more of the capacitors respectively connected between one out of the plurality of first wires and one out of the plurality of second wires.

In one embodiment, the passive quadripole includes a plurality of capacitors respectively connected between the first wire and the second wire, where at least one capacitor is connected on one side of the magnetic core and where at least one further capacitor is connected on another side of the magnetic core.

In one embodiment, the magnetic core comprises a plurality, especially three or four, E-shaped magnetic core components. Therein, the at least one electrical conductor, especially respectively, passes through windows defined by the plurality of E-shaped magnetic cores.

In an implementation, the magnetic core comprises a plurality of E-shaped magnetic core components, and wherein the at least one electrical conductor is respectively divided so as to pass through windows defined by the plurality of E-shaped magnetic core components.

In an implementation, the at least one electrical conductor is divided by comprising a plurality of wires which each pass through a different window defined by the plurality of E-shaped magnetic cores and/or which are grouped together so as to pass through different windows (as a group) defined by the plurality of E-shaped magnetic cores. For instance, one wire passes through a first window defined by the plurality of E-shaped magnetic core components, whereas another wire passes through another window defined thereby.

For example, a group of for example four wires passes through a first window of the plurality of E-shaped magnetic core components, whereas a group of other four wires passes through another window defined by said plurality of E-shaped magnetic core components. In an implementation, the number of wires comprised in each aforementioned group is not necessarily the same. For instance, one group may comprise one wire, whereas another group may comprise two or more wires. In an implementation, the number of wires comprised in each group is the same.

For example, the electrical conductor comprises 24 wires. Therein, for example, the 24 wires are grouped into six groups of four wires, each group of four passing through one window defined by three E-shaped magnetic core components and one I-shaped magnetic core component. Such an arrangement of core components defines six windows, namely two windows between a first and a second E-shaped core component, two windows between the second and a third E-shaped core component, and two windows between the third E-shaped core component and the I-shaped magnetic core component.

Advantageously, at least one leg of at least one E-shaped magnetic core component is tapered. In an implementation, at least one middle leg of at least one (respectively) E-shaped magnetic core component is tapered.

In an implementation, the taper is in direction away from the body portion of the E-shaped magnetic core component.

In an implementation, the taper is one-sided. In other words, the taper defines substantially a right triangle as a head or end of the respective leg of the E-shaped magnetic core in an implementation. In addition (for instance, with respect to different legs) or alternatively thereto, the taper may be double-sided so as to define, as an end of the respective leg, an isosceles triangle or the like.

In an implementation, the passive quadripole is configured to exhibit resistive behavior at the electrical conductor's self-resonant frequency, i.e. has a high impedance at said self-resonant frequency. Further in an implementation, the passive quadripole is configured to have a low impedance at the operating frequency of the primary electronic unit, i.e. the inverter thereof. In an implementation, the self-resonant frequency is 50 to 100 times larger than the operating frequency. For example, the operating frequency is roughly 60-70 kHz, whereas the self-resonant frequency of the electrical conductor is roughly 4 MHz.

In an implementation, the passive quadripole comprises a lower impedance at an operating frequency of the transmitter unit than at the self-resonant frequency of the at least one electrical conductor.

In an implementation, the impedance of the passive quadripole at the operating frequency of the transmitter unit is less than or equal to 0.1, especially less than or equal to 0.05, especially less than or equal to 0.01, times the impedance of the passive quadripole at the self-resonant frequency of the at least one electrical conductor.

In an implementation, the impedance of the passive quadripole at the operating frequency of the transmitter unit is less than or equal to an impedance range times the impedance of the passive quadripole at the self-resonant frequency of the at least one electrical conductor, wherein the impedance range is selected between 0.1 to 0.01.

In an implementation, the passive quadripole is an inductor configured to saturate at less than or equal to 67% (or ⅔ rounded), especially less than or equal to 50%, especially less than or equal to 33% (or ⅓ rounded), of a rated current of the transmitter unit.

In an implementation, the inductor is configured to saturate at less than or equal to a current ratio of a rated current of the transmitter unit, wherein the current ratio is 67% to 33% or ⅔ to ⅓.

In an implementation, the term "to saturate at . . . " denotes at least near-complete saturation. In other words, at higher currents than the aforementioned saturation currents, the inductance of the passive quadripole will only vary insignificantly in an implementation, for example by no more than 2%-5% relative to its maximum inductance.

Advantageously, an inductance of the passive quadripole is at or near its maximum between 0 and ⅓ of a rated current of the transmitter unit. Therein, the inductance of the passive quadripole is at or near its minimum from ⅔ of the rated current and higher, wherein the inductance of the passive quadripole comprises a soft transition between ⅓ and ⅔ of the rated current in an implementation. In an implementation, the soft transition is especially a substantially linear transition. In other words, the inductance of the passive quadripole comprises a linear transition between ⅓ and ⅔ of the rated current of the transmitter unit in an implementation.

In an implementation, the soft transition between maximum and minimum inductance extends over a range of ⅙, ⅓, or ½, of the rated current. Therein, the range of soft transition is defined as a range (or difference) in current between maximum and minimum inductance values in an implementation.

In an implementation, the passive quadripole is an inductor, especially a magnetic core, wherein the inductance minimum corresponds to a saturation of the inductor, especially the magnetic core.

Thereby, the inductance of the passive quadripole is high, especially at or near its maximum, at low currents. Thus, the passive quadripole exhibits advantageously high inductance near a zero-crossing of the alternating current output by the primary electronic unit and can therefore damp the ringing of the electrical conductor especially at the zero-crossing. Further, due to the inductance of the passive quadripole being low, especially at or near its minimum, at higher currents, current losses caused by the inductance of the passive quadripole are suppressed at currents at which the ringing of the electrical conductor is negligible or non-existent.

In one embodiment, the wireless power transmission system further comprises a moveable load which comprises a receiver unit configured to receive wireless power transmitted by the transmitter unit.

In an implementation, the wireless power transmission system further comprises a receiver unit installed at a movable load and configured to receive wireless power transmitted by the transmitter unit.

The moveable load is an electric vehicle comprising batteries and an electric motor in an implementation.

The present disclosure also concerns a wireless power supply system for a vehicle. Therein, the wireless power supply system comprises the wireless power transmission system according to any one of the foregoing described embodiments. Furthermore, the wireless power supply system comprises a vehicle comprising a receiver unit configured to receive wireless power transmitted by the transmitter unit of the wireless power transmission system. In an implementation, the receiver unit is installed at an electric vehicle.

In one embodiment, the receiver unit of the wireless power supply system is comprised especially by an electric vehicle.

Particularly, the electric vehicle is an industrial vehicle such as a forklift, or an elevator.

BRIEF DESCRIPTION OF DRAWINGS

Further details, advantages, and features of the embodiments of the present disclosure are described in detail with reference to the figures.

DESCRIPTION OF EMBODIMENTS

Figures 1, 2:
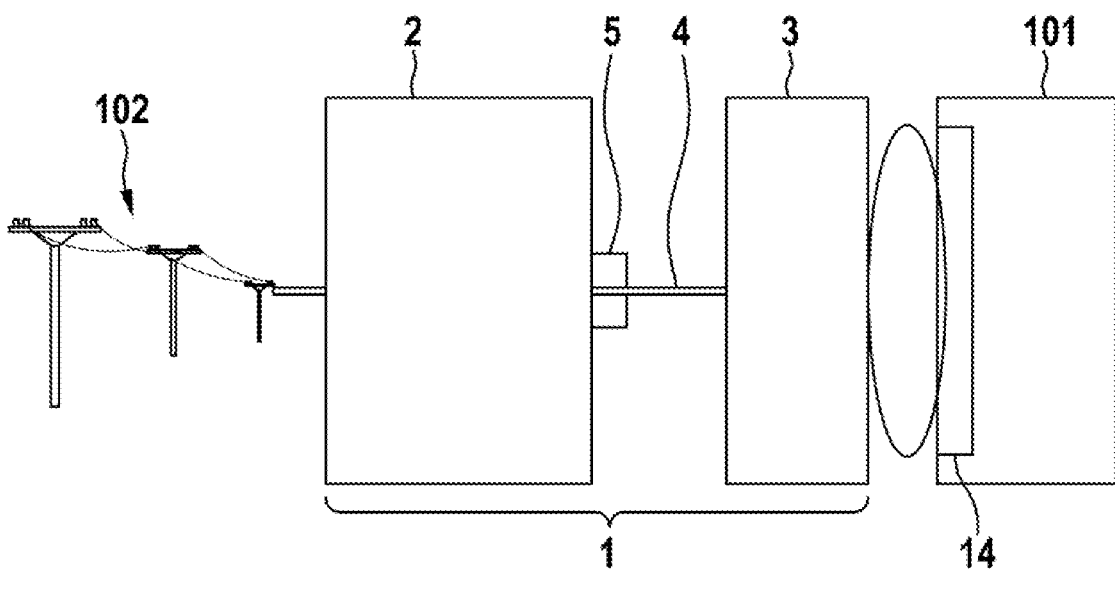
FIG. 1 shows a schematic diagram of a wireless power transmission system according to a first embodiment of the present disclosure.
FIG. 2 shows a detail view of components of the wireless power transmission system according to the first embodiment of the present disclosure.

FIG. 1 shows a schematic diagram of a wireless power transmission system 1 according to a first embodiment of the present disclosure.

The wireless power transmission system 1 comprises a primary electronic unit 2 and a transmitter unit 3 for wireless power transmission. In particular, the transmitter unit 3 is for example a primary pad for wireless power transfer ("WPT") to a receiver unit 14 (secondary pad) of a moveable load 101. The primary electronic unit 2 is for example a wall box and comprises power electronics for converting electric energy taken from a grid 102 to an alternating current, which is supplied to the transmitter unit 3. In particular, the primary electronic unit 2 comprises an inverter.

The moveable load 101 is for instance an electric vehicle 103 (see also FIG. 9) comprising batteries, an electric motor, and the receiver unit 14.

The alternating current output by the primary electronic unit 2 is supplied to the transmitter unit 3 via at least one electrical conductor 4 of the wireless power transmission system 1. In the present embodiment, as will be explained in more detail below, the electrical conductor 4 comprises one or more cables for feeding the alternating current to the transmitter unit 3.

In general, the (at least one) electrical conductor 4 exhibits a specific wave impedance of between 10 and 100 Ohm and a self-resonance between 3 and 10 MHz. The primary electronic unit 2, specifically its power electronics, more specifically the inverter thereof, has an advantageously low impedance so as to achieve high efficiency. This results in a mismatched connection, in which a step in voltage will trigger the self-resonance in the electrical conductor 4.

This will be explained based on a comparative example not employing the solution of the present disclosure.

Figure 6:
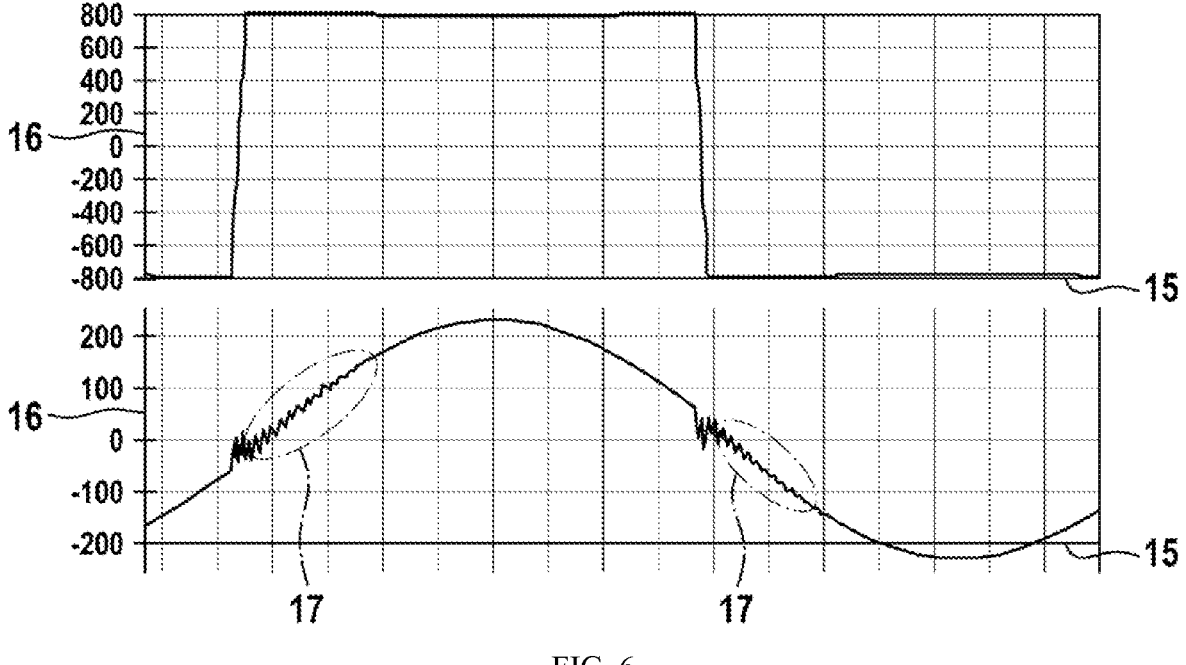
FIG. 6 shows two graphs depicting output voltage and current of a primary electronic unit of a wireless power transmission system according to a comparative example.

For a comparative example, this effect is shown in the graphs of FIG. 6, which show (top) an output voltage of a primary electronic unit and (bottom) an output current thereof according to a comparative example. Therein, an abscissa 15 is time in seconds s and an ordinate 16 is voltage in Volt V (top) and current in Ampere A (bottom). The aforementioned and shown output voltage and output current of the primary electronic unit are measured directly at the primary electronic unit.

As can be taken from the bottom graph of FIG. 6, current ringing, denoted by reference numeral 17, occurs when polarity of the current switches, i.e. when crossing a zero-crossing. This current ringing 17 is due to self-resonance of the electrical conductor 4.

Referring back to FIG. 1, the wireless power transmission system 1 of the present embodiment of the present disclosure comprises a passive quadripole 5 disposed between the primary electronic unit 2 and the transmitter unit 3. The passive quadripole 5 comprises a frequency selective impedance for impedance matching between an output of the primary electronic unit 2 and the at least one electrical conductor 4.

The at least one electrical conductor 4 passes through the passive quadripole 5.

Figure 7:
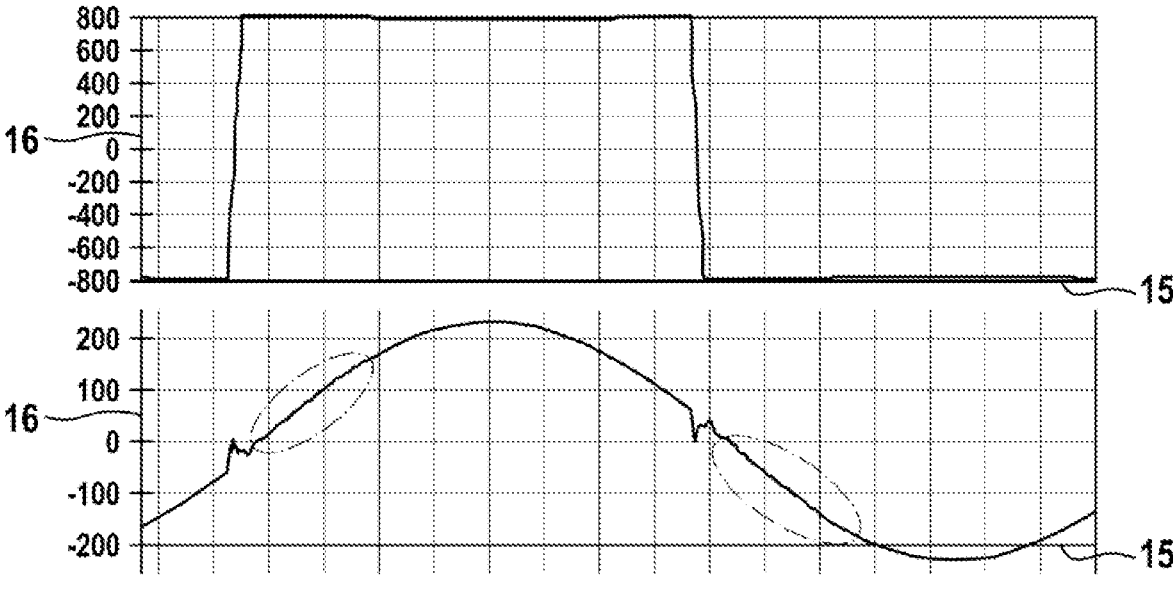
FIG. 7 shows two graphs depicting output voltage and current of a primary electronic unit of the wireless power transmission system according to the first embodiment of the present disclosure.

FIG. 7 shows two graphs depicting output voltage and current of a primary electronic unit 2 of the wireless power transmission system 1 according to the first embodiment of the present disclosure. Essentially, FIGS. 6 and 7 show a comparison of the wireless power transmission system 1 according to the embodiment of the present disclosure (FIG. 7) and a comparative example (FIG. 6).

As can be taken from FIG. 7, current ringing (17 of FIG. 6) is advantageously reduced or damped.

Referring to FIG. 2, the passive quadripole 5 of the present embodiment will be explained. FIG. 2 shows a detail view of components of the wireless power transmission system 1 according to the first embodiment of the present disclosure. In particular, FIG. 2 shows a detail view of the primary electronic unit 2, the electrical conductor 4, and the passive quadripole 5.

In the present embodiment, the electrical conductor 4 comprises two wires 11, 12, namely a first wire 11 and a second wire 12. The first wire 11 carries a forward signal (+) to the transmitter unit 3 and the second wire 12 carries a return signal (−) from the transmitter unit 3, i.e. to the primary electronic unit 2. In other words, the first wire 11 is connected to one pole of the primary electronic unit 2 (specifically, the inverter thereof), and the second wire 12 is connected to another pole of the primary electronic unit 2 (specifically, the inverter thereof).

The wires 11, 12 may be multiple wires 11, 12 comprised by a single electrical conductor that is split or divided, or may be multiple, individual electrical conductors. In particular, the electrical conductor 4 of the present embodiment is a cable comprising the multiple wires 11, 12 and being split before the passive quadripole 5 into multiple individual electrical conductors/cables/wires.

Further, the passive quadripole 5 is an inductor, namely a magnetic core 6. The magnetic core 6 comprises an E-shaped magnetic core component 7 (henceforth "E-core") and an I-shaped magnetic core component 8 (henceforth "I-core"). The magnetic core 6 especially comprises or is formed from a ferrite.

Therein, the E-core 7 and the I-core 8 are arranged so as to define windows 9. In particular, the windows 9 are defined between two adjacent legs 10, 13 of the E-core 7, a body portion 18 of the E-core 7, and the I-core 8.

The wires 11, 12 each pass through one window 9. Thereby, the magnetic core 6, i.e. the passive quadripole 5, acts as an inductor providing an impedance for impedance matching between the output of the primary electronic unit 2 and the electrical conductor 4, i.e. the wires 11, 12 of the electrical conductor 4.

Further, as can be taken from FIG. 2, the E-core 7 comprises a middle leg 13 which has a one-side taper towards the I-core 8. Thereby, a tapered end 19 of the middle leg 13 is substantially shaped as a right triangle. Alternatively thereto, or in at least one of the other legs 10, the tapered end 19 may be double-sided so as to define an isosceles triangle or the like.

The taper has an advantageous effect of a gradual or smooth transition of non-saturation and saturation of the magnetic core 6. This will be explained in further detail below with respect to FIG. 5.

Figure 3:
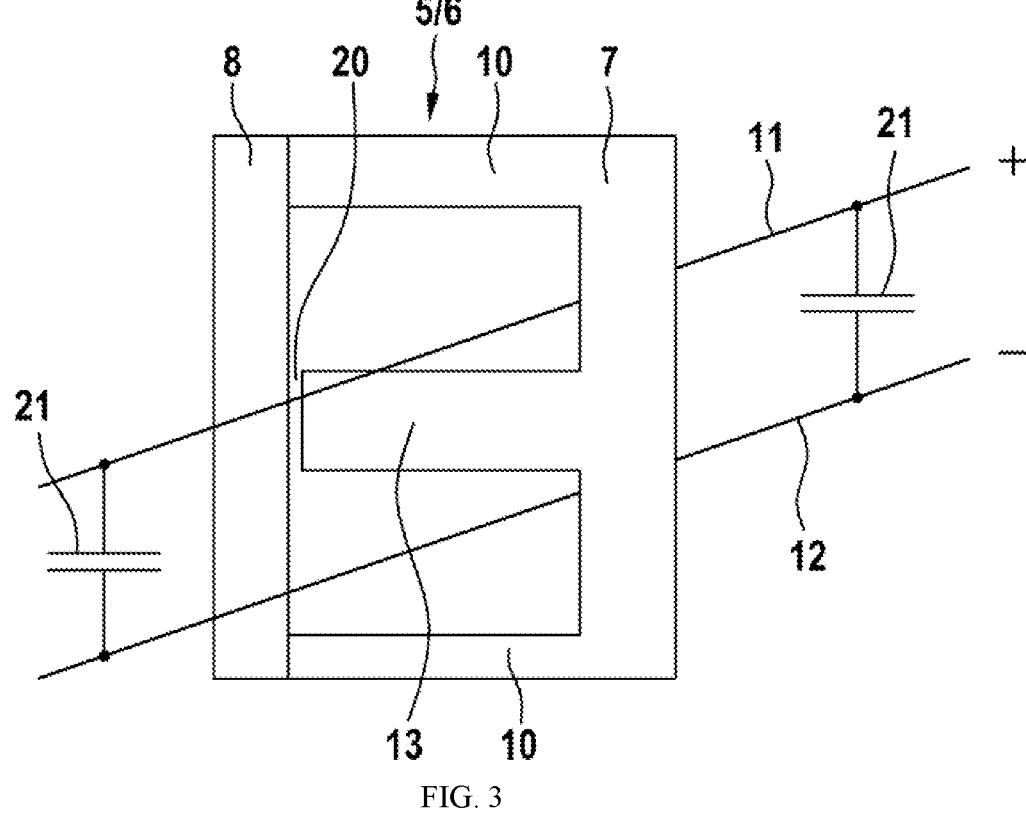
FIG. 3 shows a detail view of a passive quadripole of a wireless power transmission system according to a modification of the first embodiment of the present disclosure.

FIG. 3 shows a detail view of the passive quadripole 5, here as a magnetic core 6, according to a modification to the first embodiment of the present disclosure.

Therein, the E-core 7 does not comprise a tapered middle leg 13. Instead, an air gap 20 is provided between the middle leg 13 and the I-core 8. This air gap 20 has an advantageous effect of reducing inductance and losses of the magnetic core 6.

Further, for improved selective impedance matching, the passive quadripole 5 comprises two capacitors 21 connected between the first wire 11 and the second wire 12. Each of the capacitors 21 is provided on one side, i.e. before and after passing through, of the magnetic core 6.

The passive quadripole 5 may comprise only one of the capacitors 21, or three or more of the capacitors 21. In particular, in case of a plurality of first wires 11 and a plurality of second wires 12, the passive quadripole 5 may comprise one or more of the capacitors 21 respectively connected between one out of the plurality of first wires 11 and one out of the plurality of second wires 12.

Figure 4:
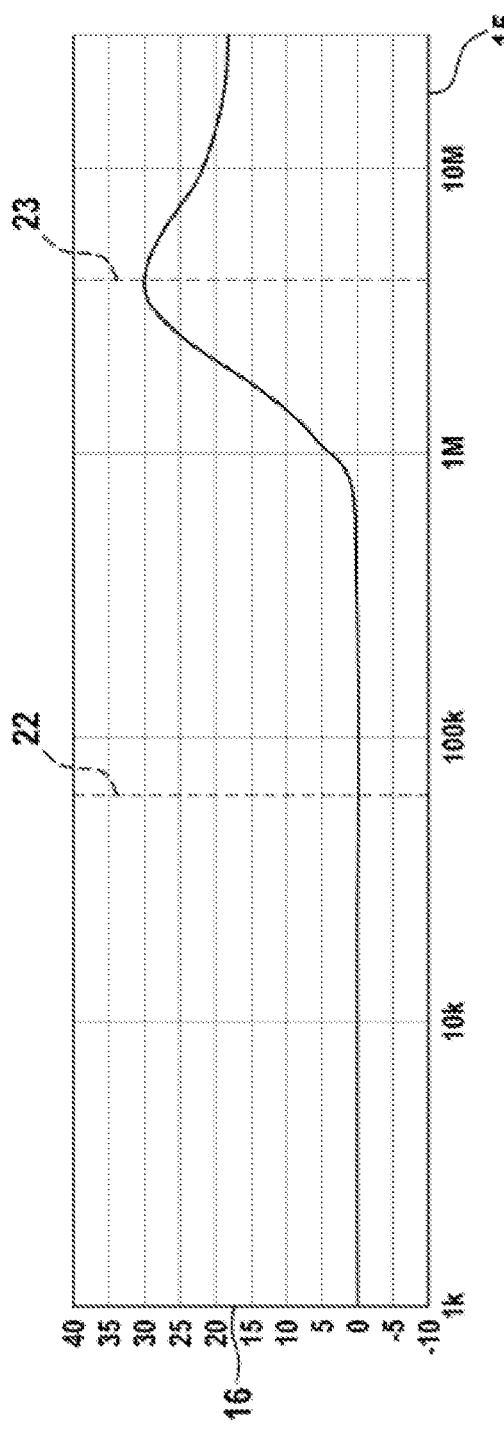
FIG. 4 shows a graph depicting an impedance versus frequency curve of a passive quadripole of the wireless power transmission system according to the first embodiment of the present disclosure.
Figure 5:
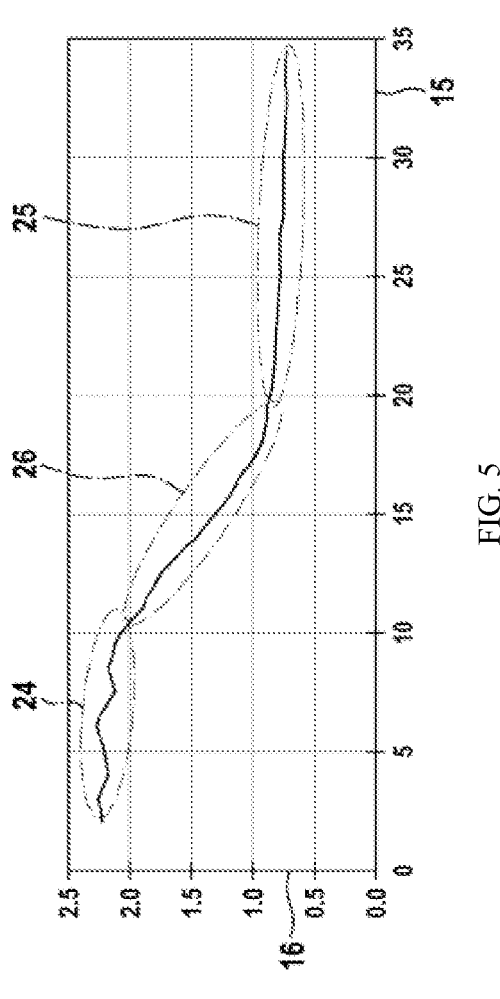
FIG. 5 shows a graph depicting an incremental inductance versus current curve of the passive quadripole of the wireless power transmission system according to the first embodiment of the present disclosure.

FIGS. 4 and 5 show graphs depicting measurement results of measurements on the passive quadripole 5 of the present embodiment. In particular, FIG. 4 shows a graph depicting an impedance versus frequency curve of the passive quadripole 5 of the wireless power transmission system 1 according to the first embodiment of the present disclosure and FIG. 5 shows a graph depicting an incremental inductance versus current curve of the passive quadripole 5 of the wireless power transmission system 1 according to the first embodiment of the present disclosure.

In FIG. 4, the abscissa 15 depicts frequency in Hz ("k"="kHz"; "M"="MHz"), and the ordinate 16 depicts impedance in Ohm of the passive quadripole 5 shown in FIG. 2.

In FIG. 4, for reference, a fundamental operating frequency 22 is marked. Further yet, a self-resonance frequency 23 of the electrical conductor 4 is marked.

As can be taken from FIG. 4, the passive quadripole 5 has a maximum impedance at a frequency of roughly 4 MHz, which corresponds to the self-resonance frequency 23 of roughly 4 MHz of the electrical conductor 4 in the present embodiment. In other words, the passive quadripole 5 has a lower impedance at an operating frequency of the transmitter unit 3 than at the self-resonant frequency 23 of the at least one electrical conductor 4. As is apparent from FIG. 4, the impedance of the passive quadripole 5 at the operating frequency of the transmitter unit, i.e. at the fundamental operating frequency 22, is less than or equal to 0.1 times the impedance of the passive quadripole 5 at the self-resonant frequency of the at least one electrical conductor 4.

Therefore, the passive quadripole 5 can advantageously damp or reduce current ringing caused by the self-resonance of the electrical conductor 4, more precisely by the impedance mismatch between the primary electronic unit 2 and the electrical conductor 4, as demonstrated in FIG. 7.

Further, the passive quadripole 5 has minimal, effectively zero, impedance at the fundamental operating frequency 22 of 60-70 kHz such that high efficiency of the wireless power transmission system 1 is achieved.

In the graph shown in FIG. 5, the abscissa 15 denotes current in Ampere and the ordinate 16 depicts an incremental inductance in micro Henry μH of the passive quadripole 5 shown in FIG. 2.

Generally, at higher currents, the magnetic core 6 will saturate and its inductance will decrease, as depicted in FIG. 5. Furthermore, due to the tapered middle leg 13, a transition (denoted by reference numeral 26) from non-saturation (denoted by reference numeral 24), for instance between 0 A and 10 A, to saturation (denoted by reference numeral 25), for instance at or above 20 A, is soft, substantially linear in an implementation. This has the advantage that the self-resonance frequency of the electrical conductor 4 is not triggered by a sudden or steep transition 26 between non-saturation 24 and saturation 25, thereby further advantageously reducing current ringing.

In the present embodiment, an exemplary rated current of the transmitter unit 3 is 30 A. This embodiment is employed for 10 kW applications in an implementation. As can be further taken from FIG. 5, the magnetic core 6 is configured to saturate nearly completely at 20 A, so at roughly equal to or less than roughly 67% (⅔ rounded) of the rated current of the transmitter unit 3. Therefore, the passive quadripole 5, i.e. the magnetic core 6, is nearly lossless for a large range of operation following the zero-crossing due to saturation thereof and its inductance decreasing.

In an implementation, the soft transition 26 between maximum inductance at non-saturation 24 and minimum inductance at saturation 25 extends over a range of roughly 10 A, which in the present embodiment is 10 A, i.e. in a range of roughly ⅓ of the rated current.

Figure 8:
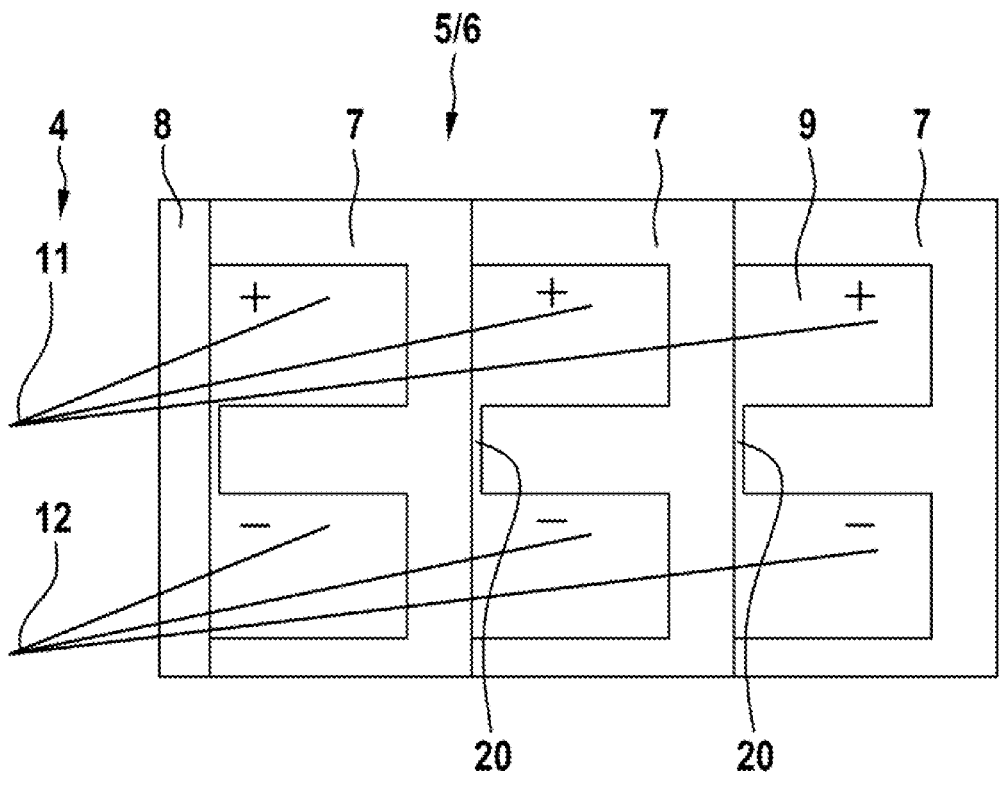
FIG. 8 shows a detail view of a passive quadripole of a wireless power transmission system according to a second embodiment of the present disclosure.

FIG. 8 shows a detail view of a passive quadripole 5 of a wireless power transmission system 1 according to a second embodiment of the present disclosure.

Therein, the passive quadripole 5 is an inductor, more specifically a magnetic core 6.

The passive quadripole 5 comprises a plurality, especially two or more, in an implementation three or more or four or more E-shaped magnetic cores 7. In the present embodiment, the magnetic core 6 comprises three E-cores 7 and one I-core 8. Thereby, the magnetic core 6 defines six windows 9, namely two between a first E-core 7 and a second E-core 7 (from right to left), two between the second E-core 7 and a third E-core 7, and two between the third E-core 7 and the I-core 8.

Further, the electrical conductor 4 is divided into six groups of wires 11, 12. In the present embodiment shown in FIG. 8, each of the six groups of wires 11, 12 comprises one wire 11, 12.

Although not shown, each group of wires 11, 12 may comprise more than one wire 11, 12. For example, the electrical conductor comprises in total 24 wires. Therein, for example, the 24 wires 11, 12 are grouped into six groups of four wires 11, 12 instead of the shown six groups of one wire 11, 12, each such group of four wires 11, 12 passing through one window 9.

Thereby, the current from the primary electronic unit 2 to the transmitter unit 3 via the passive quadripole 5 may be divided among multiple magnetic core components 7, 8, such that inductance at rated current and losses in each core are reduced.

Furthermore, as shown in FIG. 2 and FIG. 3, any one or multiple of the E-cores 7 shown in FIG. 8 may comprise an air gap 20 and/or a taper, especially in a middle leg thereof. Outer legs of the multiple E-cores 7 shown in FIG. 8 comprise no air gap or taper.

The present embodiment is used in 30 kW applications with a rated current of up to 90 A in an implementation. In such applications, the aforementioned advantages and measurement examples (FIGS. 4 to 7) also apply accordingly, especially with respect to relative values.

Figure 9:
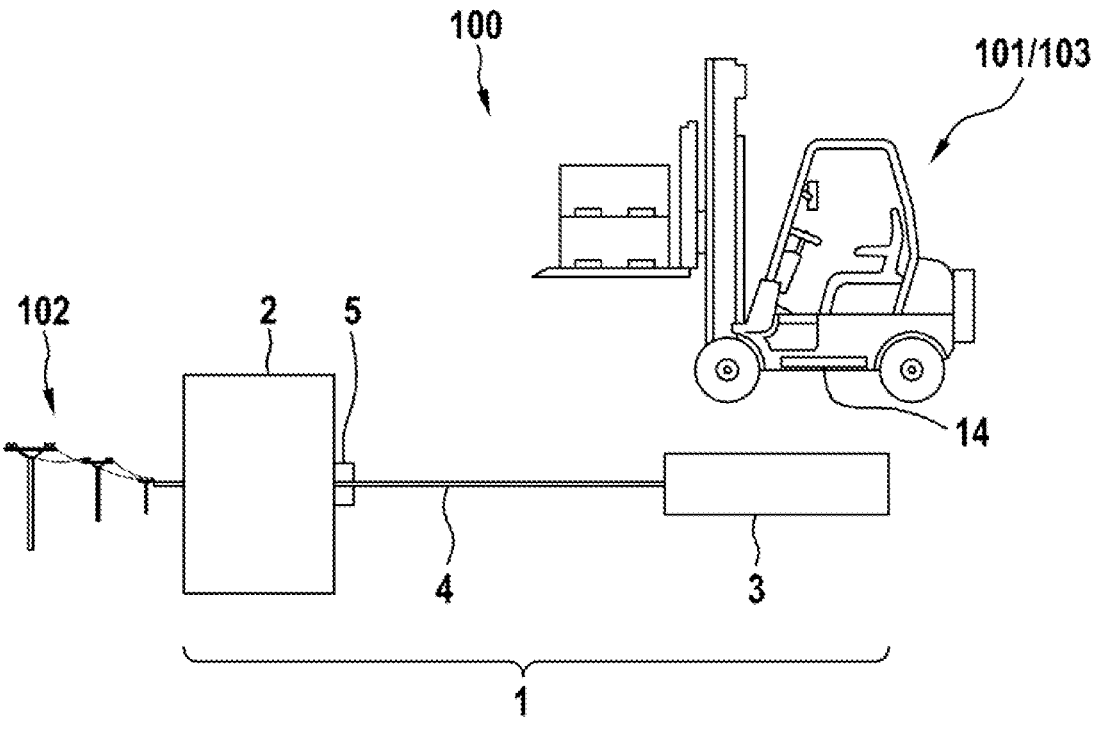
FIG. 9 shows a schematic diagram of a wireless power supply system according to an embodiment of the present disclosure.

FIG. 9 shows a schematic diagram of a wireless power supply system 100 according to an embodiment of the present disclosure.

The present disclosure also concerns a power supply system 100 for a vehicle 103. The vehicle 103 of the present embodiment corresponds to the moveable load 101 shown in FIG. 1. As shown in FIG. 9, the vehicle 103 is especially an industrial vehicle such as a forklift.

Therein, the power supply system 100 comprises the wireless power transmission system 1 according to the foregoing description. Further, the power supply system 100 comprises a receiver unit 14 configured to receive wireless power transmitted by the transmitter unit 3 of the wireless power transmission system 1 and comprised by the vehicle 103.

The receiver unit 14 is further connected to on board electronics and a battery management system (not shown) of the vehicle 103 for charging batteries thereof.

In addition to the foregoing written explanation of the disclosure, it is explicitly referred to FIGS. 1 to 9, which in detail show features of the disclosure.

What is claimed is:

1. A wireless power transmission system, comprising:
   a primary electronic unit;
   a transmitter unit for wireless power transmission;
   at least one electrical conductor connecting the primary electronic unit and the transmitter unit, wherein the primary electronic unit is configured to supply an electric signal to the transmitter unit via the at least one electrical conductor; and
   a passive quadripole disposed between the primary electronic unit and the transmitter unit and comprising a frequency selective impedance for impedance matching between an output of the primary electronic unit and the at least one electrical conductor;
   wherein the at least one electrical conductor passes through the passive quadripole.

2. The wireless power transmission system according to claim 1, wherein the passive quadripole is an inductor.

3. The wireless power transmission system according to claim 2, wherein the inductor is a magnetic core.

4. The wireless power transmission system according to claim 3, wherein the magnetic core comprises at least one E-shaped magnetic core component and an I-shaped magnetic core component.

5. The wireless power transmission system according to claim 4, wherein the at least one electrical conductor respectively passes through windows defined between two adjacent magnetic legs of the E-shaped magnetic core component and the I-shaped magnetic core component.

6. The wireless power transmission system according to claim 5, wherein the at least one electrical conductor respectively comprises a plurality of wires, at least one of the wires is a first wire carrying a forward signal to the transmitter unit and at least one other of the wires is a second wire carrying a return signal to the primary electronic unit, and wherein the at least one first wire and the at least one second wire pass through different windows.

7. The wireless power transmission system according to claim 6, wherein the passive quadripole comprises at least one capacitor.

8. The wireless power transmission system according to claim 7, wherein the capacitor is connected between the first wire and the second wire.

9. The wireless power transmission system according to claim 8, wherein the passive quadripole comprises a plurality of capacitors respectively connected between the first wire and the second wire, wherein at least one capacitor is connected on one side of the magnetic core and wherein at least one further capacitor is connected on another side of the magnetic core.

10. The wireless power transmission system according to claim 4, wherein the magnetic core comprises a plurality of E-shaped magnetic core components, and wherein the at least one electrical conductor is respectively divided so as to pass through windows defined by the plurality of E-shaped magnetic core components.

11. The wireless power transmission system according to claim 10, wherein the magnetic core comprises three E-shaped magnetic core components, and wherein the electrical conductor comprises twenty four wires, wherein the wires are grouped into six groups of each four wires, and wherein each group of four wires passes through one of the six windows defined by the three E-shaped magnetic core components and the one I-shaped magnetic core component.

12. The wireless power transmission system according to claim 4, wherein at least a middle leg of at least one E-shaped magnetic core component is tapered.

13. The wireless power transmission system according to claim 1, wherein the passive quadripole comprises a lower impedance at an operating frequency of the transmitter unit than at the self-resonant frequency of the at least one electrical conductor.

14. The wireless power transmission system according to claim 13, wherein the impedance of the passive quadripole at the operating frequency of the transmitter unit is less than or equal to an impedance range times the impedance of the passive quadripole at the self-resonant frequency of the at least one electrical conductor, wherein the impedance range is selected between 0.1 to 0.01.

15. The wireless power transmission system according to claim 2, wherein the inductor is configured to saturate at less than or equal to a current ratio of a rated current of the transmitter unit, wherein the current ratio is 67% to 33% or $\frac{2}{3}$ to $\frac{1}{3}$.

16. The wireless power transmission system according to claim 1, wherein an inductance of the passive quadripole is at or near its maximum between 0 and $\frac{1}{3}$ of a rated current of the transmitter unit, and wherein the inductance of the passive quadripole is at or near its minimum from $\frac{2}{3}$ of the rated current and higher, wherein the inductance of the passive quadripole comprises a linear soft transition between $\frac{1}{3}$ and $\frac{2}{3}$ of the rated current.

17. The wireless power transmission system according to claim 1, further comprising a receiver unit installed at a movable load and configured to receive wireless power transmitted by the transmitter unit.

18. The wireless power transmission system according to claim 17, wherein the moveable load is an industrial electric vehicle.

19. A wireless power supply system for a vehicle, comprising a wireless power transmission system,
   wherein the wireless power transmission system comprises:
   a primary electronic unit;
   a transmitter unit for wireless power transmission;
   at least one electrical conductor connecting the primary electronic unit and the transmitter unit, wherein the primary electronic unit is configured to supply an electric signal to the transmitter unit via the at least one electrical conductor; and
   a passive quadripole disposed between the primary electronic unit and the transmitter unit and comprising a frequency selective impedance for impedance matching between an output of the primary electronic unit and the at least one electrical conductor;
   wherein the at least one electrical conductor passes through the passive quadripole; and
   a receiver unit installed at an electric vehicle and configured to receive wireless power transmitted by the transmitter unit of the wireless power transmission system.

* * * * *